United States Patent
Tang et al.

(10) Patent No.: US 10,147,806 B1
(45) Date of Patent: Dec. 4, 2018

(54) METHOD OF FABRICATING FLOATING GATES

(71) Applicant: UNITED MICROELECTRONICS CORP., Hsin-Chu (TW)

(72) Inventors: Bin Tang, Singapore (SG); Jubao Zhang, Singapore (SG); Xiaofei Han, Singapore (SG); Chao Jiang, Singapore (SG); Hong Liao, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/602,114

(22) Filed: May 23, 2017

(51) Int. Cl.
| | |
|---|---|
| H01L 21/283 | (2006.01) |
| H01L 21/762 | (2006.01) |
| H01L 27/11531 | (2017.01) |
| H01L 29/788 | (2006.01) |
| H01L 29/66 | (2006.01) |
| H01L 27/11521 | (2017.01) |
| H01L 21/8234 | (2006.01) |

(52) U.S. Cl.
CPC .. *H01L 29/66825* (2013.01); *H01L 21/76229* (2013.01); *H01L 21/823437* (2013.01); *H01L 27/11521* (2013.01); *H01L 27/11531* (2013.01); *H01L 29/7881* (2013.01); *H01L 21/823431* (2013.01)

(58) Field of Classification Search
CPC ......... H01L 27/10894; H01L 27/11521; H01L 27/11531; H01L 29/0649; H01L 29/66825; H01L 29/7881; H01L 21/28273; H01L 21/76229; H01L 21/823437
See application file for complete search history.

(56) References Cited

U.S. PATENT DOCUMENTS

| | | | |
|---|---|---|---|
| 6,548,353 B2 * | 4/2003 | Tseng | H01L 21/28273 257/E21.209 |
| 7,148,104 B2 | 12/2006 | Ding | |
| 2004/0147099 A1 * | 7/2004 | Hashimoto | H01L 21/76229 438/584 |
| 2005/0127473 A1 * | 6/2005 | Sakagami | H01L 21/76229 257/510 |
| 2006/0199318 A1 * | 9/2006 | Minami | H01L 21/76895 438/153 |
| 2007/0099380 A1 * | 5/2007 | Kim | H01L 21/28273 438/257 |
| 2017/0018432 A1 | 1/2017 | Pan | |

* cited by examiner

*Primary Examiner* — Yu Chen
*Assistant Examiner* — Christopher M Roland
(74) *Attorney, Agent, or Firm* — Winston Hsu

(57) ABSTRACT

A method of fabricating a floating gate includes providing a substrate divided into a cell region and a logic region. A silicon oxide layer and a silicon nitride layer cover the cell region and the logic region. Numerous STIs are formed in the silicon nitride layer, the silicon oxide layer, and the substrate. Later, the silicon nitride layer within the cell region is removed to form one recess between the adjacent STIs within the cell region while the silicon nitride layer within the logic region remains. Subsequently, a conductive layer is formed to fill the recess. The conductive layer is thinned to form a floating gate.

8 Claims, 5 Drawing Sheets

METHOD OF FABRICATING FLOATING GATES

BACKGROUND OF THE INVENTION

1. Field of the Invention

The present invention relates to a method of fabricating floating gates without pitting problems and residue on the logic region.

2. Description of the Prior Art

A flash memory is a non-volatile storage device that can be electrically erased and reprogrammed. Flash memories are commonly used in memory cards, USB flash drives and solid-state drives for general storage and transfer of data between computers and other digital products.

In general, a flash memory includes two gates. One of the gates, known as a floating gate, is used for charge storage. The second gate, known as a control gate, is used for controlling the input and output of data. The floating gate is located beneath the control gate, and is generally in a floating state because there is no connection with external circuits. The control gate is normally wired to the word line.

Present semiconductor fabrication processes generate high density flash memories and high performance logic transistors at the same wafer. The flash memories and the logic transistors will have different critical dimensions, however. Large topographic steps will be formed between the cell region for forming the flash memories and the logic region for forming the logic transistors. These large topographic steps cause pitting and residue on the logic region while forming the flash memories.

SUMMARY OF THE INVENTION

This in mind, an objective of this invention is to reduce the pitting and residue on the logic region.

According to a preferred embodiment of the present invention, a method of fabricating a floating gate includes providing a substrate divided into a cell region and a logic region. A silicon oxide layer and a silicon nitride layer cover the cell region and the logic region. Numerous STIs are embedded in the silicon nitride layer, the silicon oxide layer and the substrate. Later, the silicon nitride layer within the cell region is removed to form one recess between the STIs within the cell region while the silicon nitride layer within the logic region remains. Subsequently, a conductive layer is formed to fill the recess and cover the silicon nitride layer and the substrate. After that, the conductive layer is planarized by taking the STIs and the silicon nitride layer as a stop layer. Next, the conductive layer is thinned to form a floating gate. Finally, the STIs within the cell region are shortened.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 10 depict a method of fabricating floating gates according to a preferred embodiment of the present invention, wherein:

FIG. 1 is a stage of providing a substrate with numerous STIs thereon;
FIG. 2 is a fabricating stage following FIG. 1;
FIG. 3 is a fabricating stage following FIG. 2;
FIG. 4 is a fabricating stage following FIG. 3;
FIG. 5 is a fabricating stage following FIG. 4;
FIG. 6 is a fabricating stage following FIG. 5;
FIG. 7 is a fabricating stage following FIG. 6;
FIG. 8 is a fabricating stage following FIG. 7;
FIG. 9 is a fabricating stage following FIG. 8; and
FIG. 10 is a fabricating stage following FIG. 9.

DETAILED DESCRIPTION

Figure 1:
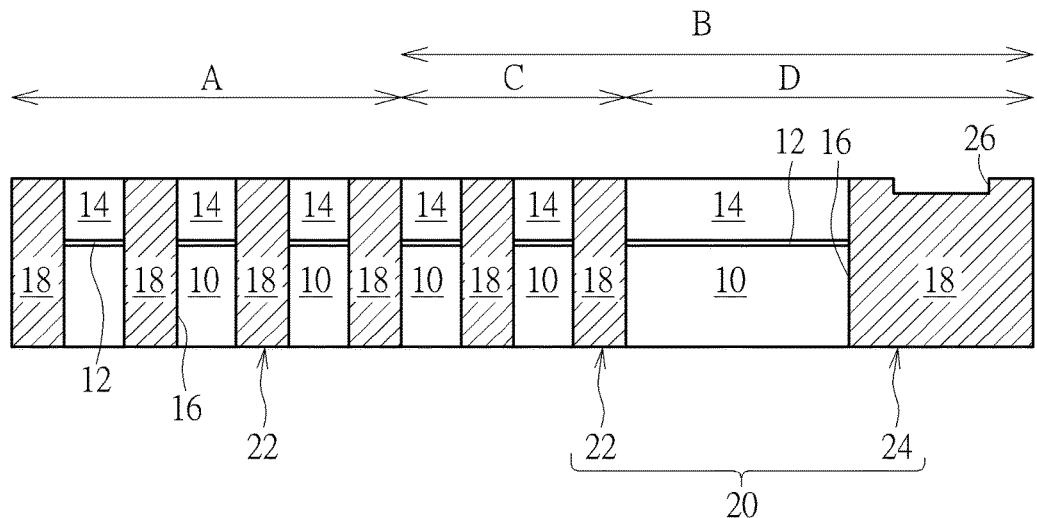

FIG. 1 to FIG. 10 depict a method of fabricating floating gates according to a preferred embodiment of the present invention. As shown in FIG. 1, a substrate 10 is provided. The substrate 10 is divided into a cell region A and a logic region B. A pad oxide 12 and a pad nitride 14 are formed in sequence to cover the substrate 10. The pad oxide 12 is silicon oxide. The pad nitride 14 is silicon nitride. Later, numerous shallow trenches 16 are formed in the substrate 10. After that, an STI filling 18 such as silicon oxide is formed to cover the pad nitride 14 and fill each of the shallow trenches 16. Then, the STI filling 18 is planarized so that the top surface of the STI filling 18 is aligned with the top surface of the pad nitride 14. At this point, numerous STIs (shallow trench isolations) 20 are formed. Each of the STIs 20 includes the STI filling 18 and the shallow trench 16. The STIs 20 include first STIs 22 and a second STI 24. The second STI 24 is wider than each of the first STIs 22. Some of the first STIs 22 are embedded in the substrate 10 within the cell region A and some of the STIs 22 are embedded within the logic region B. The second STI 24 is embedded in the substrate 10 within the logic region B. The logic region B is further divided into a dense region C and an isolation region D. The second STI 24 is used to define the active area within the isolation region D, and the first STI 22 is used to define the active area within the cell region A and the dense region C. In this embodiment, four of the first STIs 22 are within the cell region A, and two of the first STIs 22 are within the logic region B. There is only one second STI 24 in the logic region B in this embodiment; however, the number of the first STIs 22 and second STIs 24 can be altered based on different requirements. The distance between the second STI 24 and the adjacent first STI 22 in the logic region B is larger than the distance between the adjacent first STIs 22 in the cell region A. Because the second STI 24 is wider than the first STI 22, the shallow trench 16 for forming the second STI 24 is wider than the shallow trench 16 for forming the first STI 22. Therefore, when the STI filling 18 fills the wider shallow trench 16, a concave space will be formed on the surface of the STI filling 18 of the wider shallow trench 16. As a result, when planarizing the STI filling 18 to form the first STIs 22 and the second STI 24, a dishing 26 is formed on the surface of the second STI 24. The depth of the dishing 26 may be between 400 to 500 angstroms.

Figure 2:
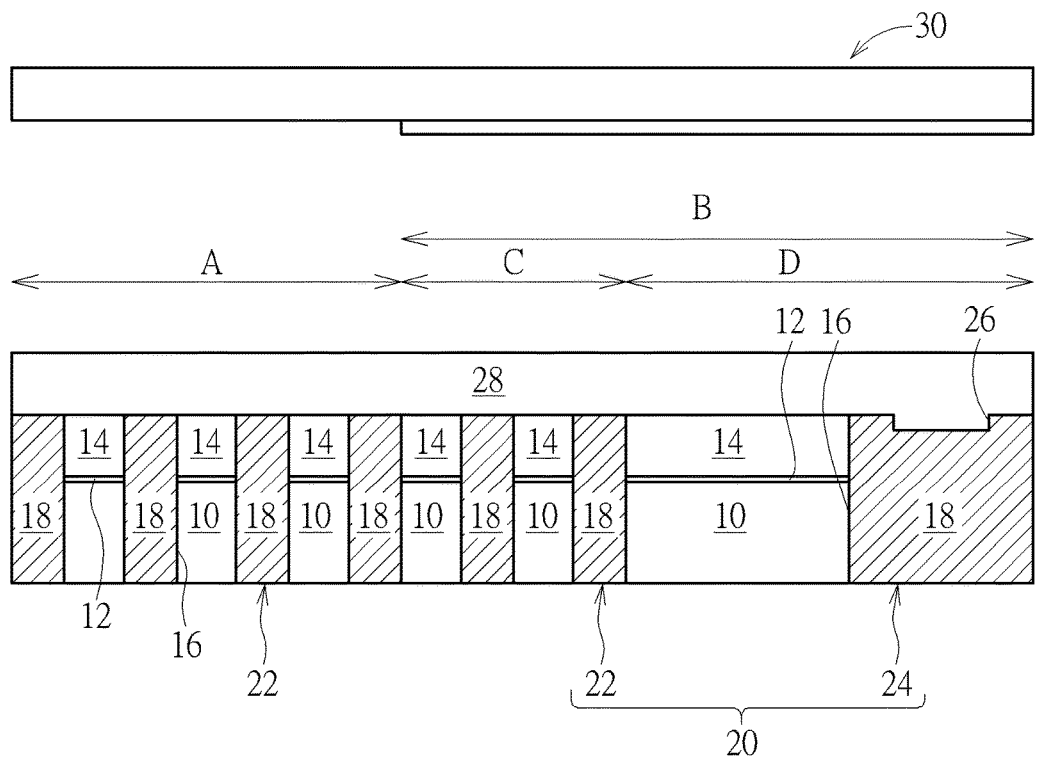
Figure 3:
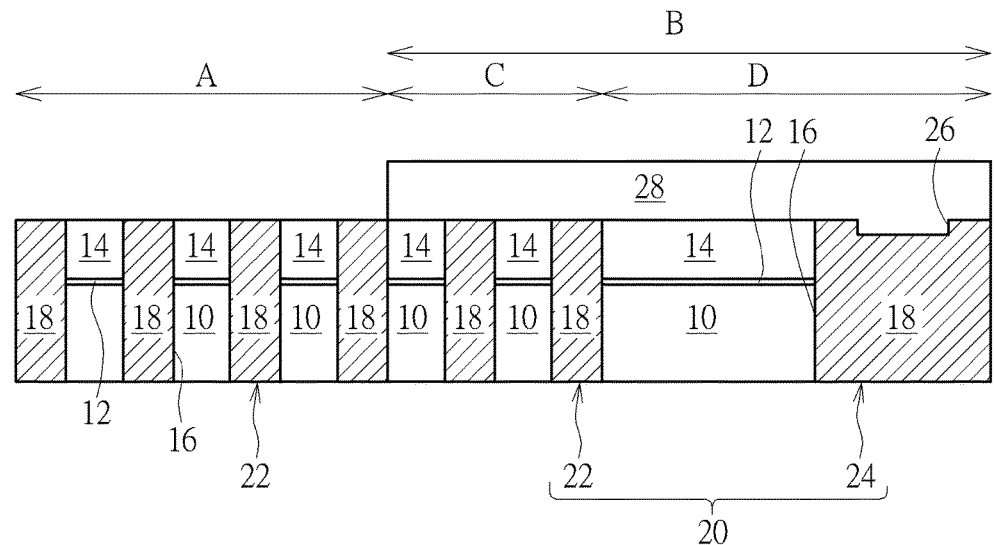

As shown in FIG. 2, a first mask layer 28 is formed to blankly cover the cell region A and the logic region B of the substrate 10. The first mask layer 28 fills the dishing 26. The first mask layer 28 is preferably a photoresist. Later, a reticle 30 is provided to define the first mask layer 28, by the first mask layer 28 being exposed to light, and the pattern on the reticle 30 being projected onto the first mask layer 28. As shown in FIG. 3, the first mask layer 28 within the cell region A is removed and the first mask layer 28 within the logic region B remains.

Figure 4:
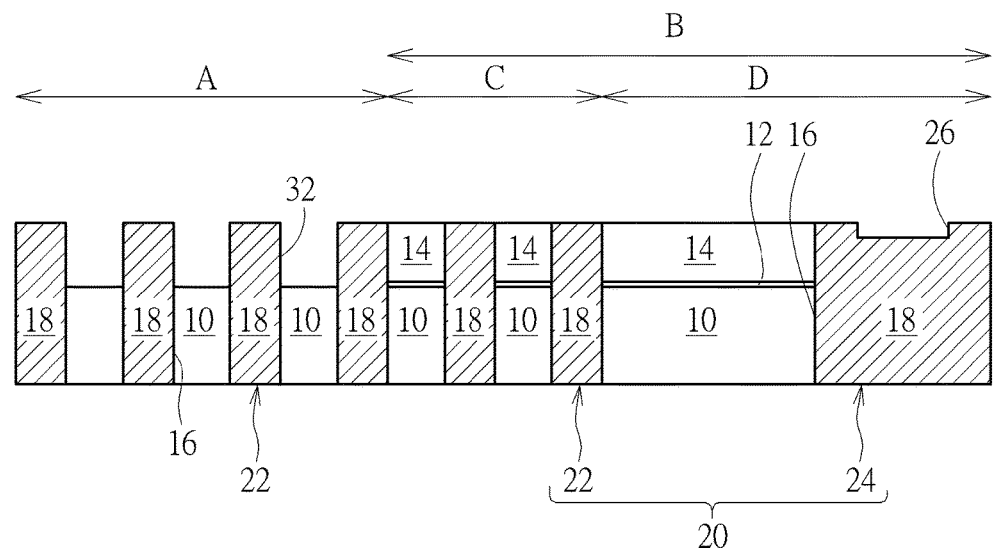
Figure 5:
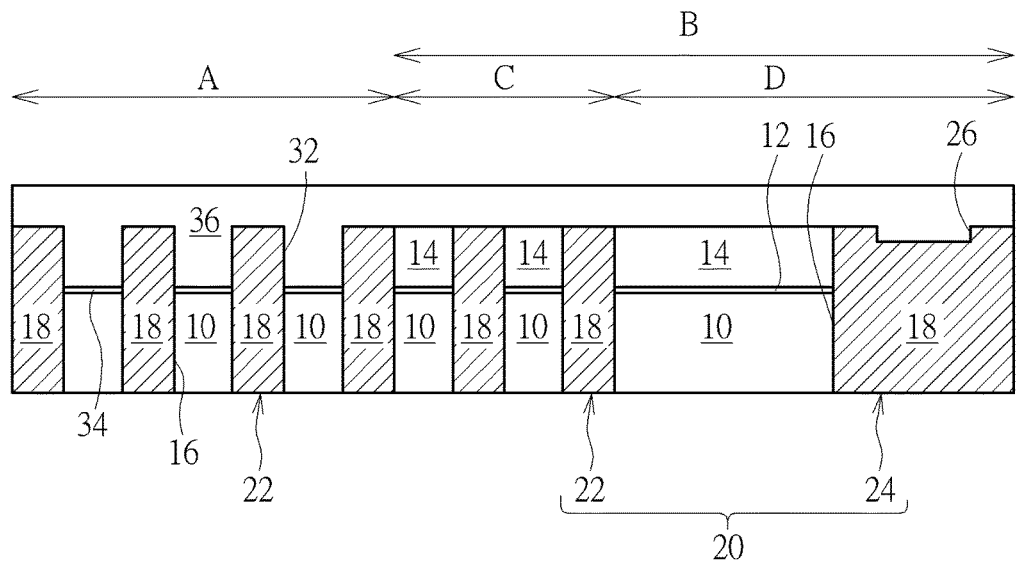

As shown in FIG. 4, the pad nitride 14 and the pad oxide 12 within the cell region A are removed by using the first mask layer 28 as a mask, while the pad nitride 14 and the pad oxide 12 within the logic region B remain. After the pad nitride 14 and the pad oxide 12 within the cell region A are removed, one recess 32 is formed between the adjacent first STIs 22 within the cell region A. Subsequently, the first mask layer 28 is entirely removed. As shown in FIG. 5, a silicon oxide layer 34 is formed on the substrate 10 exposed through the recess 32. The silicon oxide layer will serve as a gate oxide layer. The formation of the silicon oxide layer 34 is preferably via an oxidation process. After that, a conductive layer 36 is formed to fill the recess 32 and the dishing 26, and cover the pad nitride 14 and the STIs 20. The conductive layer 36 may be a polysilicon layer, a metal layer, a SiGe layer or other conductive materials.

Figure 6:
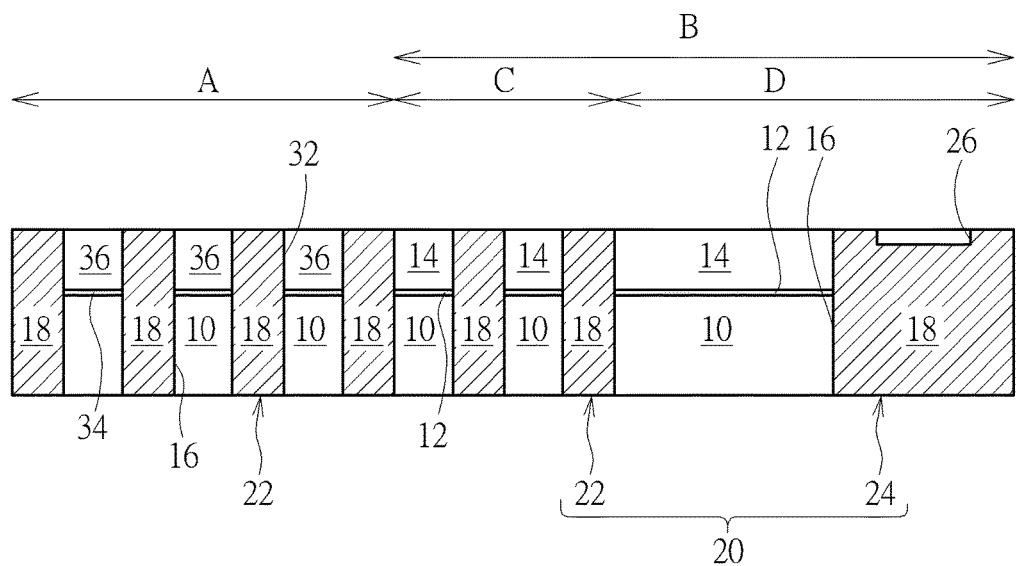

As shown in FIG. 6, the conductive layer 36 is planarized by using the pad nitride 14 and the STIs 20 as a stop layer. The conductive layer 36 is preferably planarized by a chemical mechanical planarization process. In a conventional method, the pad nitride within the logic region is removed while removing the pad nitride within the cell region. Several recesses will be formed not only in the cell region, but also in the logic region. As mentioned above, the distance between the second STI and the adjacent first STI in the logic region is larger than the distance between the adjacent first STIs in the cell region. Therefore, the recess formed by removing the pad nitride in the isolation region will be wider than the recess in the cell region. After forming the conductive layer, the recess in the isolation region and the dense region is also filled by the conductive layer. Because the recess in the isolation region is wider than the recess in the cell region, a concave space will be formed on the top surface of the conductive layer in the recess within the isolation region. Therefore, after the conductive layer is planarized, a pitting will be formed in the conductive layer within the isolation region. Unlike the conventional method, the method of the present invention specifically keeps the pad nitride 14 within the logic region B while the pad nitride 14 within the cell region A is removed. Therefore, the conductive layer 36 does not need to fill in the recess within the isolation region D, and the pitting will not be formed.

Figure 7:
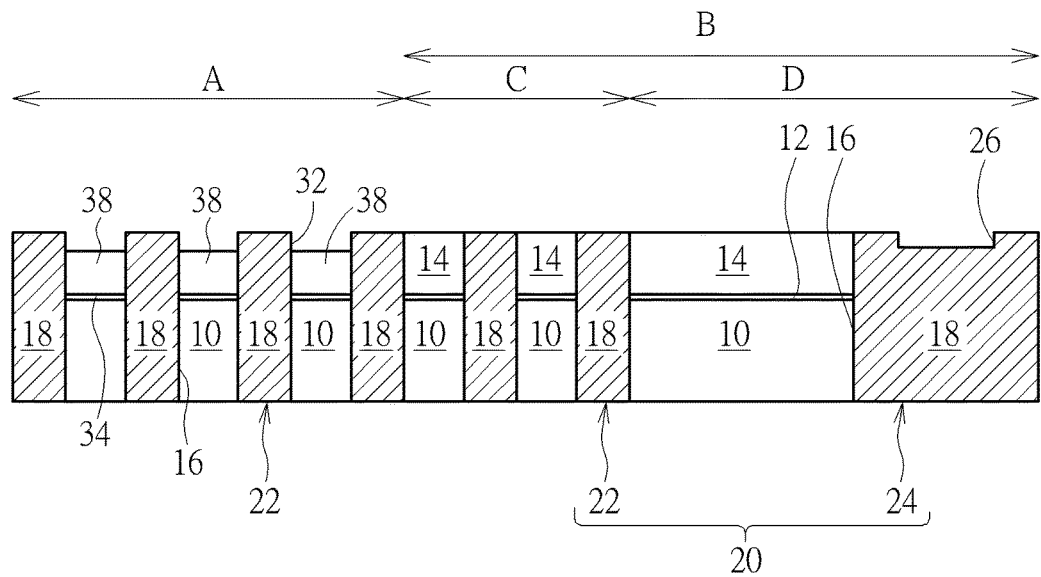
Figure 8:
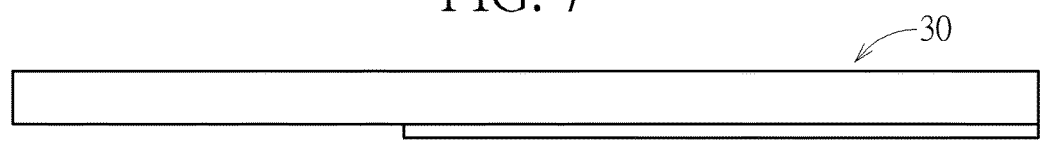
Figure 8:
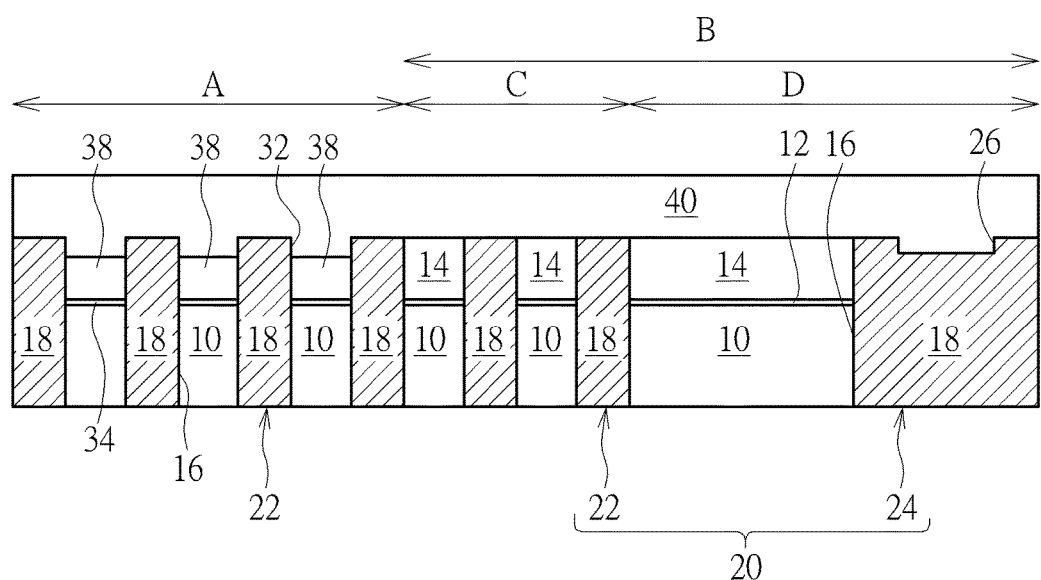

As shown in FIG. 7, the conductive layer 36 is thinned to form numerous floating gates 38. More specifically, only the height of the conductive layer 36 is reduced. In these steps, the conductive layer 36 filling the dishing 26 is entirely removed, thereby exposing the dishing 26. The depth of the dishing 26 is now 100 to 200 angstroms, which is smaller than the depth of the dishing 26 in FIG. 1. As shown in FIG. 8, a second mask layer 40 is blankly formed to cover the cell region A and the logic region B of the substrate 10. The second mask layer 40 is preferably a photoresist layer. Then, the reticle 30 used in FIG. 2 is provided again to define the second mask layer 40, by exposing the second mask layer 40 to light, and the pattern on the reticle 30 is projected onto the second mask layer 40.

Figure 9:
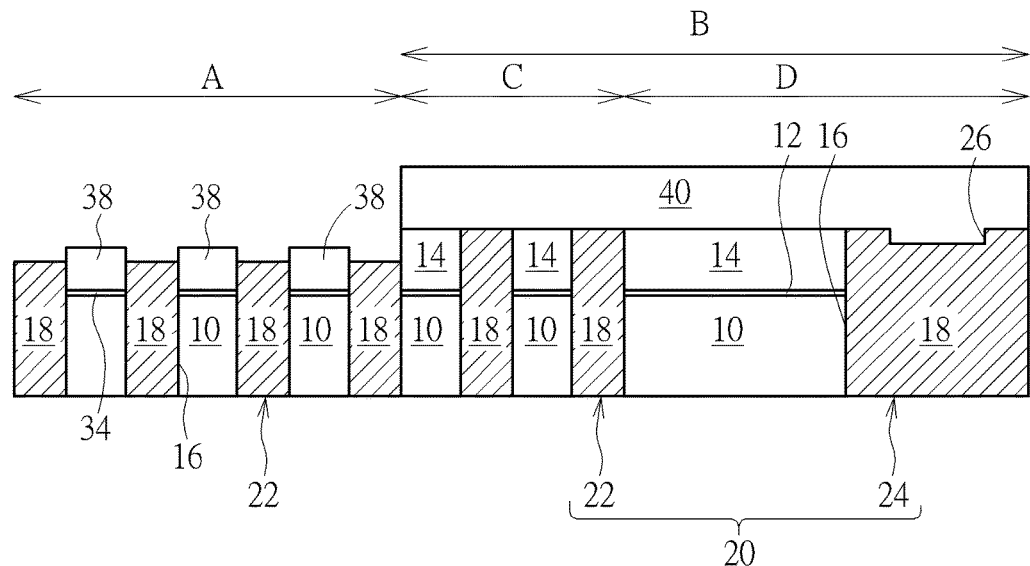

As shown in FIG. 9, the second mask layer 40 within the cell region A is removed while the second mask layer 40 within the logic region B remains. After removing the second mask layer 40 within the cell region A, the first STIs 22 in the cell region A are exposed. Later, the first STIs 22 in the cell region A are shortened by taking the second mask layer 40 as a mask. The thickness of each of the first STIs 22 is shortened to be about 0.25 to 0.4 of the thickness of each of the floating gates 38. For example, if the thickness of each of the floating gates 38 is 450 angstroms, each of the first STIs 22 is shortened by 110 to 200 angstroms. At this point, the top surface of each of the floating gates 38 is higher than the top surface of each of the first STIs 22 within the cell region A. The top surface of the first STI 22 within the cell region A is lower than the top surface of the first STI 22 within the logic region B.

Figure 10:
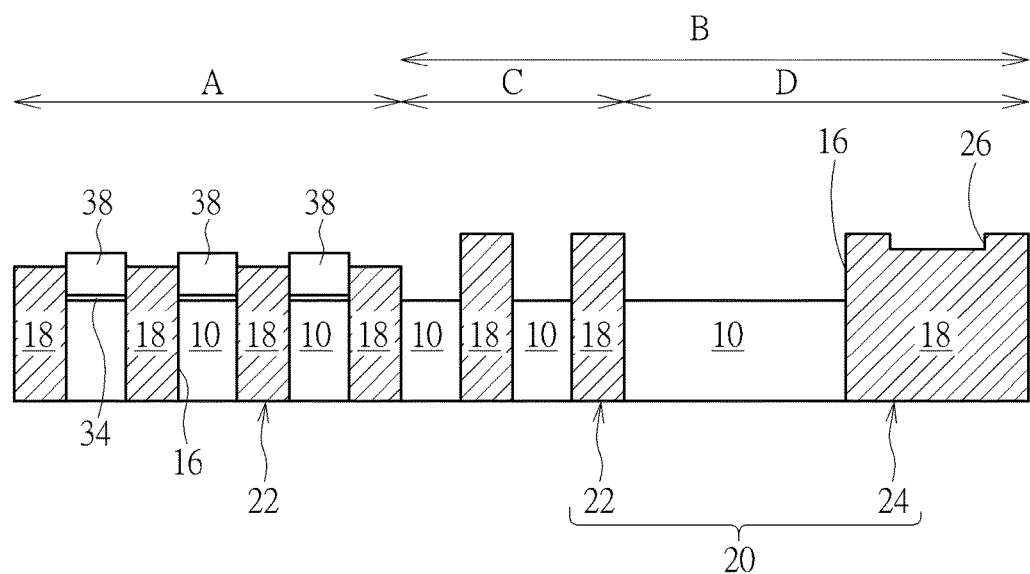

As shown in FIG. 10, the second mask layer 40 is removed. Later, the pad nitride 14 and the pad oxide 12 within the logic region B are removed entirely. It is worthy of note that the dishing 26 in the second STI 24 still remains after the floating gates 38 are formed. Moreover, although there is still a dishing 26 in the second STI 26 within the logic region B, no conductive layer 36 remains in the dishing 26. Furthermore, the steps of shortening the first STIs 22 in the cell region A can be performed before or after the steps of removing the pad nitride 14 and pad oxide 12 within the logic region B. For example, the pad nitride 14 and pad oxide 12 within the logic region B can be removed, followed by forming the second mask layer 40. Then, the second mask layer 40 is patterned and the first STIs 22 in the cell region A can be shortened.

After the pad nitride 14 and the pad oxide 12 within the logic region B are removed, at least one logic transistor (not shown) can be formed on the substrate 10 within the logic region B. At least one control gate (not shown) can be formed on the floating gates 38. A control gate dielectric layer can be formed between the floating gates and the control gate. The substrate 10, the control gate, the control gate dielectric layer, the silicon oxide layer 34 and the floating gates 38 constitute at least one flash memory.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a floating gate, comprising:
    providing a substrate divided into a cell region and a logic region, a silicon oxide layer and a silicon nitride layer covering the cell region and the logic region, a plurality of STIs disposed within the cell region and the logic region, and the STIs embedded in the silicon nitride layer, the silicon oxide layer and the substrate, wherein a dishing is disposed in one of the STIs;
    removing the silicon nitride layer within the cell region while retaining the silicon nitride layer within the logic region to form one recess between the STIs adjacent to each other within the cell region;
    forming a conductive layer filling the recess and the dishing and covering the silicon nitride layer and the substrate;
    planarizing the conductive layer by taking the STIs and the silicon nitride layer as a stop layer;
    thinning the conductive layer to entirely remove the conductive layer in the dishing, to make a topmost surface of the conductive layer lower than a topmost surface of each of the STIs and to form a floating gate; and
    shortening the STIs within the cell region.

2. The method of fabricating a floating gate of claim 1, wherein the step of removing the silicon nitride layer within the cell region comprises:
    forming a first mask layer blankly covering the cell region and the logic region of the substrate;

removing the first mask layer within the cell region by using a reticle to define the first mask layer; and
removing the silicon nitride layer within the cell region by using the first mask layer as a first protective mask.

3. The method of fabricating a floating gate of claim 2, wherein the step of shortening the STIs within the cell region comprises:
forming a second mask layer blankly covering the cell region and the logic region of the substrate;
removing the second mask layer within the cell region by using the reticle to define the second mask layer; and
shortening the STIs within the cell region by using the second mask layer as a second protective mask.

4. The method of fabricating a floating gate of claim 1, further comprising:
after forming the floating gate, removing the silicon nitride layer and the silicon oxide layer within the logic region.

5. The method of fabricating a floating gate of claim 1, wherein the STIs comprise a first STI and a second STI, the first STI is embedded within the substrate within the cell region and the second STI is embedded within the substrate within the logic region, the second STI is wider than the first STI, and the dishing is formed in the second STI.

6. The method of fabricating a floating gate of claim 5, wherein after forming the floating gate, a depth of the dishing is not greater than 200 angstroms.

7. The method of fabricating a floating gate of claim 5, wherein before removing the silicon nitride layer within the cell region, a depth of the dishing is greater than 400 angstroms.

8. The method of fabricating a floating gate of claim 1, further comprising:
before forming the conductive layer and after removing the silicon nitride layer within the cell region, removing the silicon oxide layer within the cell region to expose the substrate; and
forming a gate oxide layer on the substrate.

* * * * *